(12) United States Patent
Lin

(10) Patent No.: US 12,283,960 B2
(45) Date of Patent: Apr. 22, 2025

(54) LOW-POWER FAST-TRANSIENT LARGE CURRENT-SINK WITH DYNAMIC BIASING

(71) Applicant: Cypress Semiconductor Corporation, San Jose, CA (US)

(72) Inventor: Adrian Lin, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 100 days.

(21) Appl. No.: 18/307,527

(22) Filed: Apr. 26, 2023

(65) Prior Publication Data

US 2024/0364320 A1   Oct. 31, 2024

(51) Int. Cl.
*H03K 5/24*   (2006.01)
*H03K 17/16*   (2006.01)
*H03K 17/687*   (2006.01)

(52) U.S. Cl.
CPC ......... *H03K 5/2481* (2013.01); *H03K 17/162* (2013.01); *H03K 17/6871* (2013.01)

(58) Field of Classification Search
CPC ............... H03K 5/2481; H03K 17/162; H03K 17/6871; H03K 17/223; H03K 17/22; H03K 17/687; G05F 1/10; G05F 1/46; G05F 1/461; G05F 1/56; G05F 1/618
See application file for complete search history.

(56) References Cited

U.S. PATENT DOCUMENTS 7,671,575 B1 *   3/2010   Suzuki ............... H05B 45/3725
                                                    323/284

\* cited by examiner

*Primary Examiner* — Jung Kim

(57) ABSTRACT

A current-sink and method of using the same is provided for sinking transient load currents of a load coupled to a floating-rail. In one embodiment, the current-sink includes a latch system operable to receive a transient load current signal from the load and set a latch to apply a voltage to a gate of a current sinking switch. The current sinking switch includes a first source/drain (S/D) coupled to the floating-rail, and a second S/D coupled to ground, and is operable to sink the transient load current to provide a stable floating-rail voltage ($V_{SSHV}$) on the floating-rail. Generally, the latch system further includes a dynamically biased comparator for comparing $V_{SSHV}$ to a reference voltage and resetting the latch when a difference is less than a predetermined voltage. A dynamic bias circuit coupled to a latch output enables the comparator only while the transient load current is present.

11 Claims, 8 Drawing Sheets

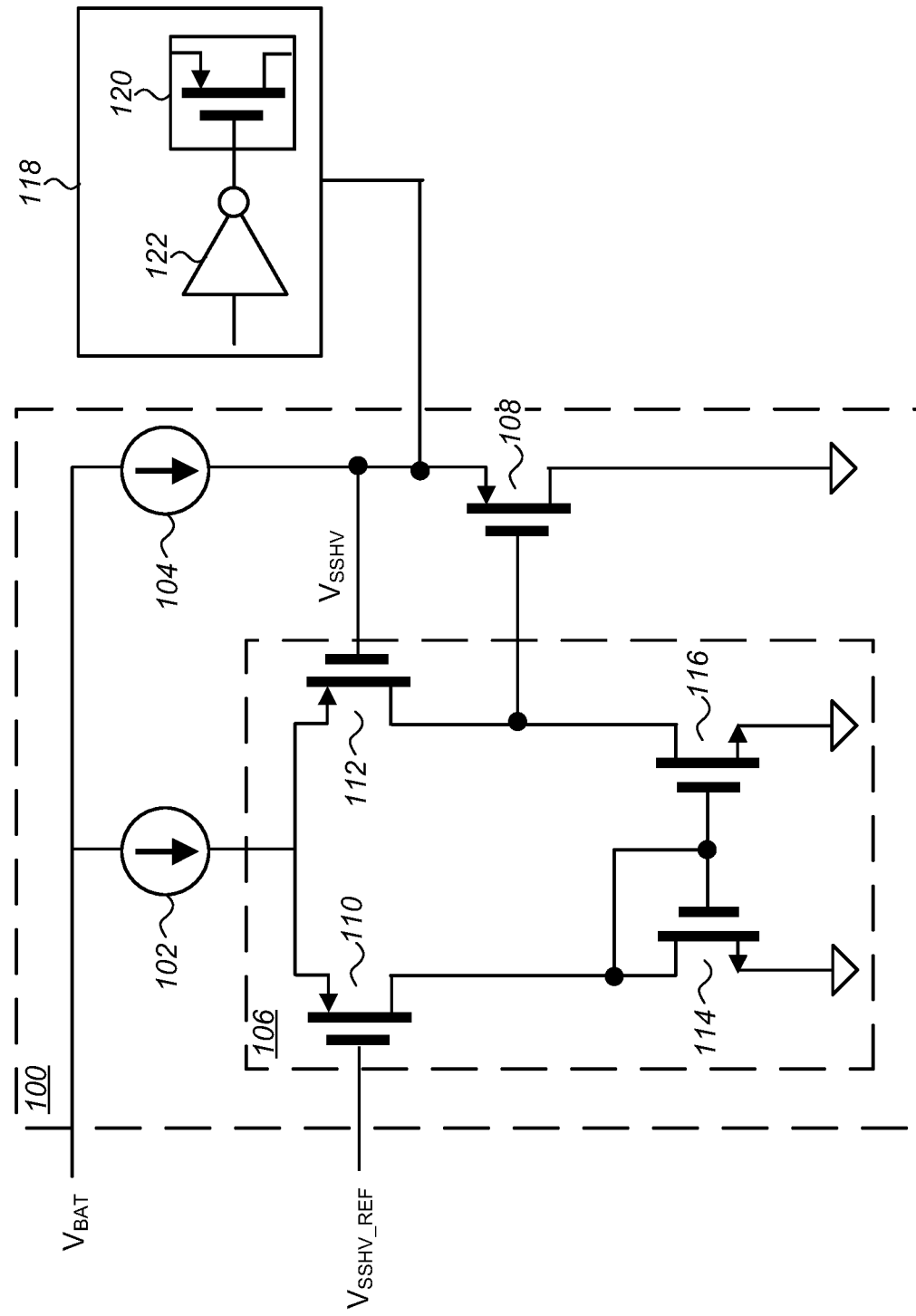
FIG. 1
(conventional)

US 12,283,960 B2

LOW-POWER FAST-TRANSIENT LARGE CURRENT-SINK WITH DYNAMIC BIASING

TECHNICAL FIELD

This present disclosure relates generally to current sinking circuits, and more particularly to a low-power, fast-transient current-sink capable of sinking large currents for use in a switching regulator or power management unit.

BACKGROUND

Many electronic products, such as Bluetooth radios, automotive infotainment systems, and Wi-Fi hubs and receivers include microcontroller units (MCU) or programmable systems on a chip (PSoC), in which a processor unit, memory, and communication interfaces and peripherals are integrally formed as a single integrated circuit (IC) or die with a power management unit (PMU) or Switching Regulator (SR) designed to provide stable, noise free DC voltage to logic devices in the IC. Typically, the logic devices are fabricated using metal-oxide-semiconductor field-effect (MOS) transistors capable of operating with gate-to-source voltage of about 1.8 volts (V) across their gate oxides (Gox), i.e., 1.8V Gox devices. In the past the PMU or SR could be fabricated on the same IC using 2.5V Gox devices, which were required to allow continuous operation at battery or DC input voltages ranging from 1.6V to 4.8 V. However, as semiconductor fabrication technologies shrink the size of logic MOS devices to 28 nanometers (nm) or 22 nm and beyond, process limitations prevents the use of 2.5V Gox and 1.8V Gox devices in the same die, thus only 1.8V Gox devices are available to use for both the logic devices of the MCU and power transistors or devices of the PMU or SR. With only 1.8V Gox devices available for use, the PMU or SR must use a floating-rail architecture to limit the gate-to-source voltage across the power transistors or devices to 1.8 V. However, this 1.8V Gox limitation will limit a minimum battery or DC input voltage of state-of-the-art floating-rail architectures.

FIG. 1 is a schematic diagram of a conventional current sinking circuit or current-sink having a p-type or p-channel MOS (PMOS) voltage follower topology commonly used in or with conventional PMUs or SRs. Referring to FIG. 1, the current-sink 100 includes a first current source 102 and a second current source 104 coupled in parallel to a DC input voltage ($V_{BAT}$), a differential amplifier 106 coupled between the first current source 102 and ground, and a first PMOS transistor 108 coupled between the second current source 104 and ground and having a gate coupled to an output of the differential amplifier. The differential amplifier 106 includes second and third PMOS transistors 110, 112, that have sources coupled in parallel to the first current source 102 and drains coupled to ground through a current-sink formed by a diode connected first n-type or n-channel MOS (NMOS) transistor 114 and a second NMOS transistor 116.

In operation a floating-rail reference voltage ($V_{SSHV\_REF}$) is applied to a first input of the differential amplifier 106, that is the gate of the second PMOS transistor 110, and the output of the differential amplifier on the drain of the third PMOS transistor 112 is coupled to the gate of the first PMOS transistor 108, which functions as a PMOS voltage follower to generate a floating-rail voltage ($V_{SSHV}$) on an output node between the source of the first PMOS transistor and the second current source 104. The $V_{SSHV}$ is coupled to a gate of the third PMOS transistor 112, a second input of the differential amplifier 106, and to a power amplifier or switching transistor in the PMU or SR 118, represented in this figure by a laterally-diffused PMOS (LDPMOS) transistor 120 and an inverter 122.

The current-sink 100 described above, while satisfactory under normal operating conditions, is subject to a number of disadvantages or limitations.

Firstly, to enable fast transient load current sinking requires a high quiescent current ($I_{dq}$) through the first PMOS transistor 108, resulting in the need for high quiescent biasing currents ($I_{bias}$) through the through the first and second current sources 102, 104, increasing the power consumed by the current-sink 100, and reducing the efficiency of the PMU or SR in which it is embodied. This is especially problematic when amount of transient current the current-sink 100 must sink is large.

Secondly, the floating-rail voltage ($V_{SSHV}$) generated needs to be able to go to 0V in order to satisfy the above described limitation on Gox by maintaining $V_{SSHV}$ at 1.8V below $V_{BAT}$ while allowing continuous operation at battery voltages ranging from 1.6V to 4.8 V. However, the minimum $V_{SSHV}$ that can be generated by the current-sink 100 is limited by a diode voltage of the first PMOS transistor 108 and a drain-source voltage (Vdsat) of the third PMOS transistor 112. Thus, a minimum operating battery voltage is limited to 2.7 V.

Accordingly, there is a need for a current-sink capable of rapidly sinking large transients in a current load ($I_{LOAD}$) to provide a stable floating-rail voltage ($V_{SSHV}$). It is further desirable that the current-sink is capable of operating at battery voltages less than 2.7 V, and able to quickly sink transient load currents (high $I_{dq}$) without requiring high $I_{bias}$ currents.

SUMMARY

A current-sink and method are provided for rapidly sinking to ground large, transients in a load current of a circuit or load coupled to a floating-rail. The current-sink and method are particularly useful in power management units (PMU) or switching regulators (SR) including a high-side switching transistor, such as a laterally-diffused p-channel metal-oxide semiconductor or LDPMOS.

Generally, the current-sink includes a dynamically controlled latch system having a latch system input operable to receive a transient load current signal from the load coupled to the floating-rail, and a current sinking switch coupled between the floating-rail and ground. The current sinking switch is controlled by a voltage output from a latch system output, and is operable to sink at least a portion of the transient load current from the load coupled to the floating-rail to provide a stable floating-rail voltage ($V_{SSHV}$).

The latch system generally includes a set-reset (S-R) latch, a comparator and a dynamic biasing circuit. The S-R latch is operable to output the voltage to turn on the current sinking switch when set by a pulse applied to a set input. The comparator has a first input coupled to $V_{SSHV}$ on the floating rail, a second input coupled to a floating-rail reference voltage ($V_{SSHV\_REF}$), and an output coupled to a reset input of the S-R latch. The comparator is operable to output a voltage to reset the S-R latch when a difference between $V_{SSHV}$ and $V_{SSHV\_REF}$ is less than a predetermined voltage. The dynamic biasing circuit is coupled between the latch output and a number of biasing inputs to the comparator and is enabled and enables the comparator only while the transient load current is present.

In some embodiments, the latch system further includes a logic-gate and a pulse generator. The logic-gate includes a first logic-gate input coupled to the comparator output and a logic-gate gate output coupled to the set input of the S-R latch. The pulse generator includes a pulse generator input coupled to and operable to receive the transient load current signal from the load coupled to the floating-rail, a pulse generator output coupled directly to the set input of the S-R latch, and an inverter through which the pulse generator output is coupled to a second logic-gate input of the logic-gate.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 is a schematic diagram of a conventional large current sinking circuit commonly used in or with conventional power management units (PMUs) or switching regulators (SRs);

DETAILED DESCRIPTION

A low-power, fast-transient, large current-sink and method for sinking large transient currents in an output of a floating-rail voltage generator are provided. The current-sink and methods of the present disclosure are particularly useful in portable and low-power applications such as in a power management unit (PMU) or switching regulator (SR) for Bluetooth (BT) radios, Wi-Fi hubs or receivers, and other microcontroller units (MCU).

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to 'couple' as used herein can include both to directly electrically connect two or more components or elements and to indirectly connect through one or more intervening components.

Figure 2:
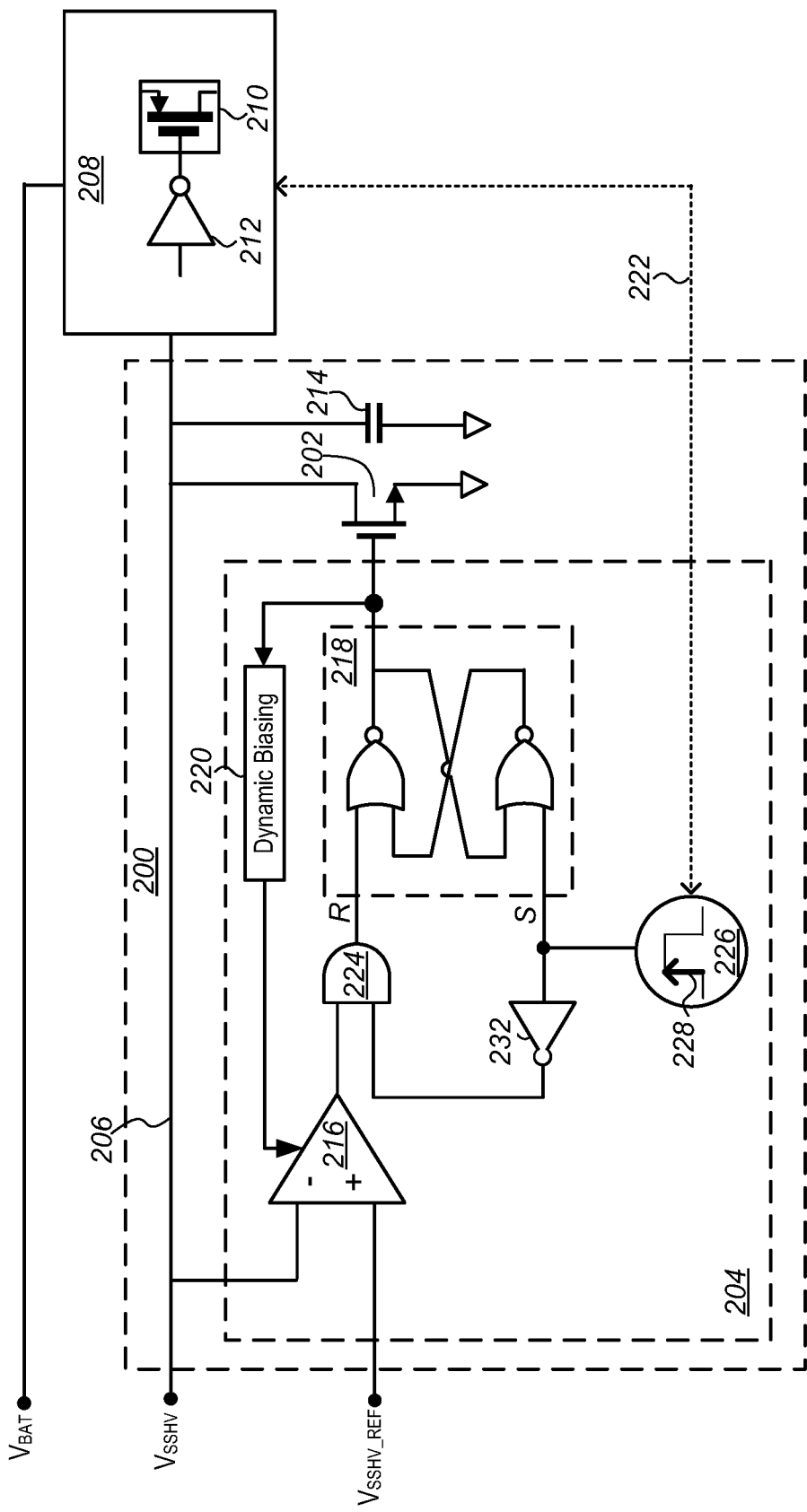
FIG. 2 is a schematic diagram of a low-power, fast-transient, large current-sink including a dynamic biasing circuit according to an embodiment of the present disclosure.

An embodiment of a current-sink 200 will now be described with reference to FIG. 2. FIG. 2 is a schematic block diagram of an embodiment of a current-sink 200. Referring to FIG. 2, the current-sink 200 generally includes a current sinking switch 202 and a dynamically controlled latch system 204. The latch system 204 has a first input coupled to a floating-rail voltage ($V_{SSHV}$) on a floating-rail 206, a second input coupled to a floating-rail reference voltage ($V_{SSHV\_REF}$), and a latch system output coupled to a control gate of the current sinking switch 202. The current sinking switch 202 further includes, in addition to the control gate, a first source/drain (S/D) terminal coupled to the floating-rail 206 and a second S/D terminal coupled to ground, and is operable to sink at least a portion of a load current ($I_{LOAD}$) from a load 208 coupled between the floating-rail and a DC input voltage ($V_{BAT}$) to provide a stable $V_{SSHV}$. The load 208 can include a High-Side Switch transistor in a switching regulator (SR), which is represented in this figure by a laterally-diffused PMOS (LDPMOS) transistor 210 and an inverter 212.

In some embodiments, such as that shown, the current-sink 200 further includes a sinking capacitor 214 coupled in parallel with the current sinking switch 202 between the floating-rail 206 and ground to sink large, fast-transients or spikes in load current.

Generally, as in the embodiment shown, the current sinking switch 202 is an n-type or n-channel MOS (NMOS) transistor.

The latch system 204 generally includes a comparator 216, a set-reset (S-R) latch 218 and a dynamic biasing circuit 220 coupled between an output of the S-R latch and the comparator. The comparator 216 has a non-inverting input coupled to $V_{SSHV\_REF}$, an inverting input coupled to the floating-rail 206, and an output coupled through a first input of a logic-gate 224 to the S-R latch 218. The S-R latch 218 has a reset input (R) coupled through an output of the logic-gate 224 to the comparator, a set input (S) coupled to a pulse generator 226 operable to receive a transient load current signal 222 from the load 208 coupled to the floating-rail and output a pulse 228 to set the S-R latch 218 on a leading edge. The S-R latch 218 further includes a latch output coupled to the control gate of the current sinking switch 202.

In some embodiments, such as that shown, the logic-gate 224 is a two input AND gate and includes a second input coupled to the pulse generator 226. The pulse generator 226 has, in addition to an input coupled to and operable to receive the transient load current signal 222, a pulse generator 226 coupled to the set (S) input of the S-R latch 218, and an inverter 232 to the second input of the logic-gate 224. The inverted pulse applies a logic '0' to the second input of the logic-gate 224, thereby ensuring that any noise or glitch generated by dynamic biasing of the comparator 216 does not result in an erroneous reset signal to the S-R latch 218. After a predetermined time equal to a pulse width of the pulse 228, a logic '1' is applied to the second input of the logic-gate 224, thereby enabling a reset signal to be coupled from the comparator 216 to the reset (R) input of the S-R latch 218 when a difference between $V_{SSHV\_REF}$ and $V_{SSHV}$ is less than a predetermined voltage.

In response to the transient load current signal 222, the pulse generator 226 outputs from the pulse generator 226 a pulse having a logic '1' to the set input (S) of the S-R latch 218. This results in a logic high, or output of about 1.8V on the latch output, which is coupled to the gate of the current sinking switch 202 turning on the switch and connecting the floating-rail 206 to ground to sink at least a portion of the transient load current. The output pulse drives the input of the inverter 232 resulting in a pulse logic '0' being applied to the second input of the logic-gate 224. This momentarily suppresses a possible glitch from the comparator 216 applied to the reset input (R) of the S-R latch 218.

At substantially the same time a logic '1' on the output of the S-R latch 218 functions as a bias enable signal, causing the dynamic biasing circuit 220 to output one or more biasing voltages to bias inputs in the comparator 216 to output a logic high when $V_{SSHV}$ is greater than $V_{SSHV\_REF}$ by a predetermined amount. At substantially the same time a logic '1' on the output of the S-R latch 218 functions as a bias enable signal, causing the dynamic biasing circuit 220 to improve the comparator 216 response time and accuracy.

At substantially the same time a load current from load 208 begins to flow into node $V_{SSHV}$ which causes node $V_{SSHV}$ to rise above $V_{SSHV\_REF}$. This subsequently switches the comparator 216 from a marginally ON state to operating in a high-precision mode, forcing the comparator to output a logic '0' through the logic-gate 224 into the reset input (R) of the S-R latch 218. The S-R latch 218 output therefore remains high forcing the current sinking switch 202 to start sinking load current from node $V_{SSHV}$ to ground, which then causes $V_{SSHV}$ to eventually decrease below $V_{SSHV\_REF}$. When this condition occurs the dynamically biased comparator 216 asserts logic '1' thus the S-R latch 218 is reset and the current sinking switch 202 is turned-off.

Operation of the current-sink 200 in response to a transient in load current will now be described with reference to the graphs of FIGS. 3A through 3H.

Figure 3A:
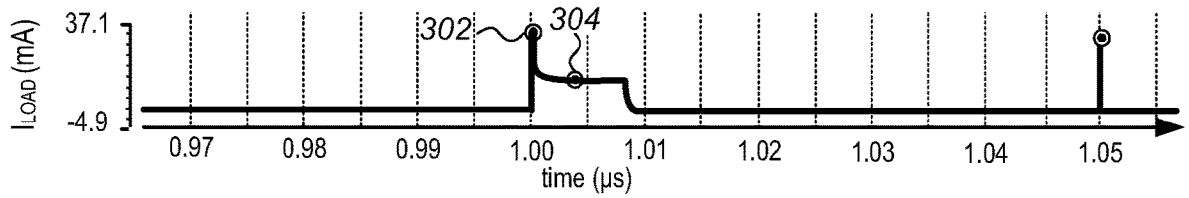
FIGS. 3A through 3H are graphs versus time of various current and voltage inputs to and resultant outputs from the current-sink of FIG. 2 during operation.

Referring to FIG. 3A, a transient in load current including a large load current spike 302 of 33.58 mA and a lower, steady load current 304 of 13.09 mA was generated on a gate of the LDPMOS transistor 210 coupled to the floating-rail 206 beginning at time of 1 μs.

Figure 3B:
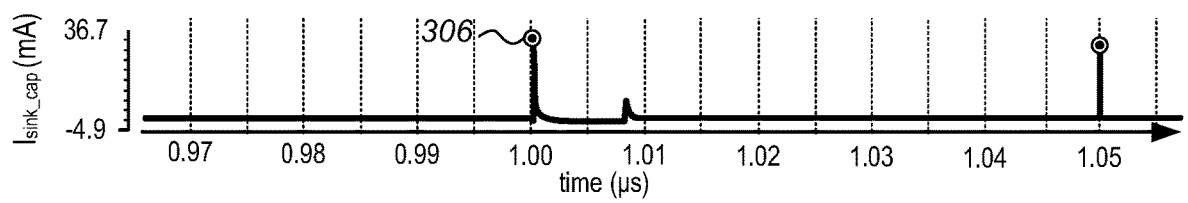

Referring to FIG. 3B the large load current spike 302 results in an immediate sinking current ($I_{sink\_cap}$ 306) through the capacitor 214 of 33.21 mA, substantially equal to the large load current spike 302 in the transient load current shown in FIG. 3A.

Figure 3C:
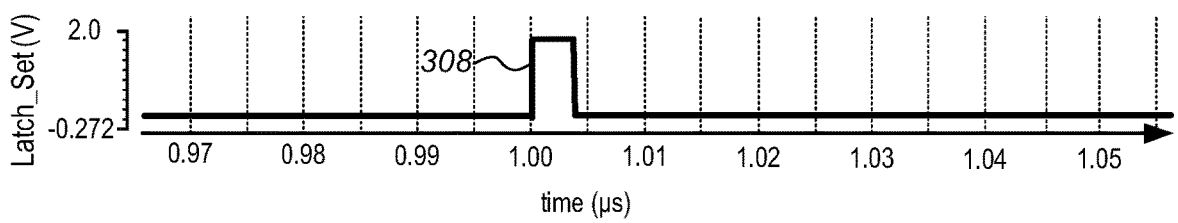

Referring to FIG. 3C, at substantially the same time a transient load current signal 222 from the load 208 causes the the pulse generator 226 to output a voltage (Latch_Set 308) of 1.8V to the set input of the S-R latch 218. Setting the S-R latch 218 results in a logic '1' on the output of the S-R latch 218 that functions both as a bias enable signal to enable the dynamic biasing circuit 220, and as a switch gate voltage to turn on the current sinking switch 202.

Figure 3D:
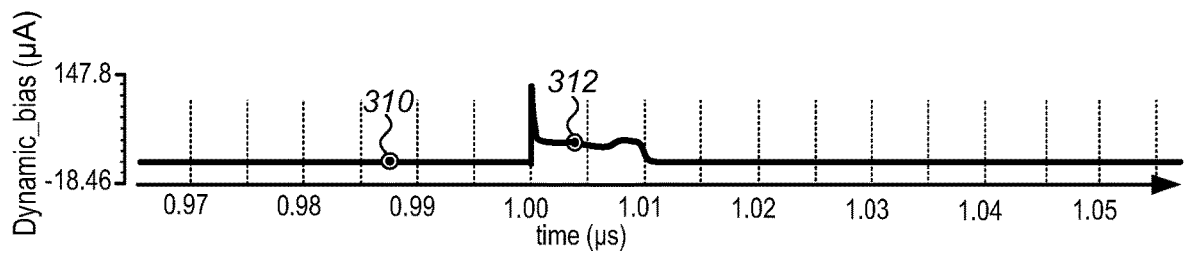

FIG. 3D illustrates the dynamic biasing current (Dynamic_bias) flowing in the dynamic biasing circuit 220 as it generates and couples one or more biasing voltages to bias inputs of the comparator 216. Referring to FIG. 3D it is noted that the dynamic biasing current increases a low initial current 310 of about 30 picoAmps (pA) to a steady current 312 of about 31.87 μA in less than 2 ns and remain high for the duration of the transient load current, shown here as about 10 ns.

Figure 3E:
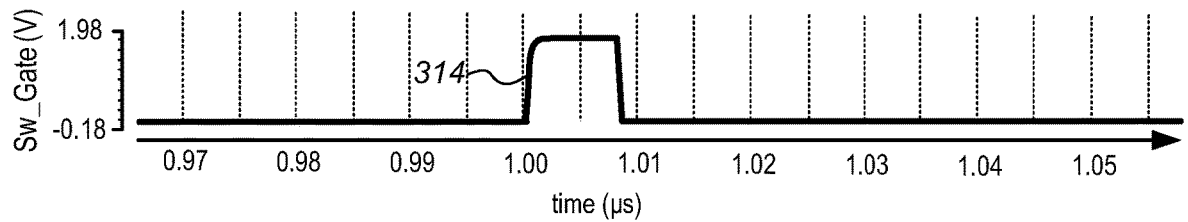

FIG. 3E illustrates the switch gate voltage (Sw_Gate 314) applied to the gate of the current sinking switch 202 from the output of the S-R latch 218. It is noted that the Sw_Gate 314 rises rapidly from an initial low voltage of about 0V to a steady c voltage of about 1.8V in less than 2 ns and remain high for the duration of the transient load current, shown here as about 10 ns.

Figure 3F:
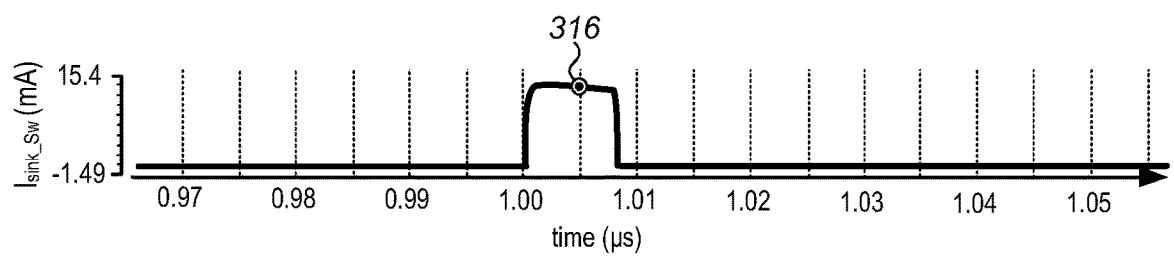

Referring to FIG. 3F it is noted that switching the current sinking switch 202 on results in a near immediate sinking current ($I_{sink\_Sw}$ 316) through the current sinking switch of about 13.70 mA, substantially equal to the steady load current 304 in the transient load current shown in FIG. 3A.

Figure 3G:
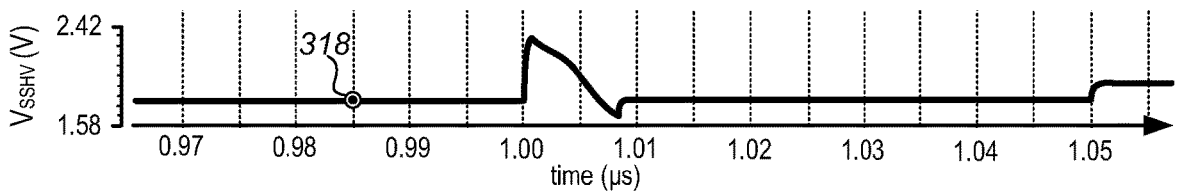
Figure 3H:
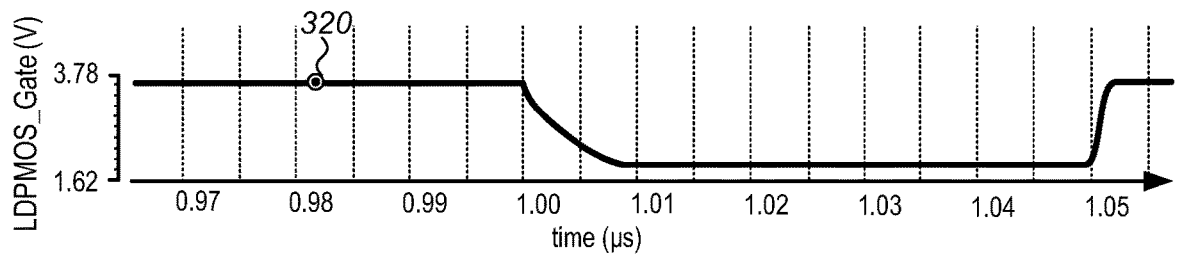

FIG. 3G illustrates the impact of the operation of the current-sink 200 in response to the transient load current on the floating-rail voltage ($V_{SSHV}$ 318). Referring to FIG. 3G it is noted that $V_{SSHV}$ starts at a low initial voltage of about 1.8V, increasing to about 2.4 at time 1 μs after which it begins rapidly decreasing, and settles back to about 1.8V after 9 ns at about time 1.009 μs FIG. 3H illustrates the impact of the operation of the current-sink 200 in response to the transient load current on a gate voltage (LDPMOS_Gate 320) of the LDPMOS transistor 210. Referring to FIG. 3H it is noted that LDPMOS_Gate 320 starts at an initial voltage of about 3.6V from which it begins rapidly decreasing beginning at time 1 μs to settle at a voltage of about 1.8V in about 8.2 ns.

Figure 4:
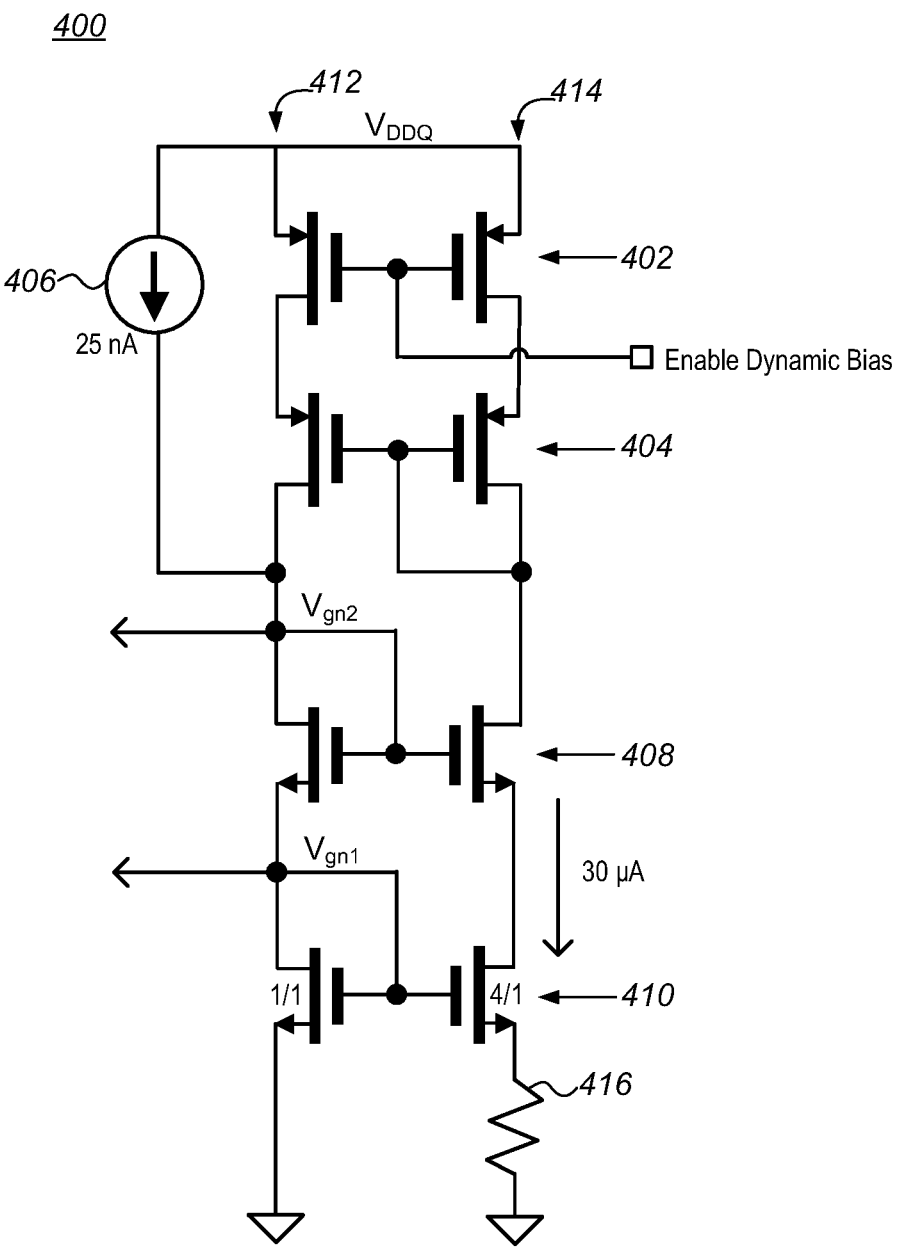
FIG. 4 is a schematic diagram of an embodiment of a dynamic biasing circuit for use in the current-sink of FIG. 2.

FIG. 4 is a schematic diagram of an embodiment of a dynamic biasing circuit for use in the current-sink of FIG. 2. Briefly, the dynamic biasing circuit 400 is or functions as a Vgs/R current reference that is enabled only when Enable Dynamic Bias signal is set to logic '0' during the current sinking phase. When enabled the circuit produces a bias current of approximately 30 uA, otherwise it is approximately 25 nA. Referring to FIG. 4, dynamic biasing circuit 400 includes two pairs of PMOS transistors 402, 404, coupled in parallel with a current source 406 between a voltage supply ($V_{DDQ}$) and through two pairs of NMOS transistors 408, 410, to ground. The first pair of PMOS transistors 402 operate as a switch to turn on the dynamic biasing circuit 400 when the enable dynamic bias signal is received. In operation, when the enable dynamic bias signal is not present the current source 406 raises gate voltages of the two pairs of NMOS transistors 408, 410, at nodes $V_{gn1}$ and $V_{gn2}$ above ground, pre-biasing the NMOS transistors, and thereby enabling a very fast turn-on time for the dynamic biasing circuit 400. When the enable dynamic bias signal is received the first pair of PMOS transistors 402 are turned-on causing a current flow through first and second legs 412, 414, of the dynamic biasing circuit 400 and turning on the second pair of PMOS transistors 404, which function as a current mirror to ensure equal current flow the PMOS transistors in both the first and second legs 412, 414. The increased current quickly turns-on the two pairs of NMOS transistors 408, 410, which then operate as a cascode current mirror passing a 30 μA current through a large resistor 416 in the second leg 414 of the dynamic biasing circuit 400, and generating voltages on nodes $V_{gn1}$ and $V_{gn2}$ to dynamically bias the comparator 216 from barely on to a high-precision mode. By high-precision it is meant that the comparator 216 is operable to detect differences between $V_{SSHV\_REF}$ and $V_{SSHV}$ of about 1 mV, or less with a 1 ns propagation delay. Referring again to FIG. 4, applying Kirchhoff's Voltage Law (KVL) a $V_{GS}$ of the left transistor (1/1) of the second pair of NMOS transistors 410, equals a $V_{GS}$ of the right transistor (4/1) plus the voltage across resistor 416. Larger device ratio of the right transistor (4/1) indicates a smaller $V_{GS}$, than the $V_{GS}$ of the left transistor (1/1) for the same drain currents.

Figure 5:
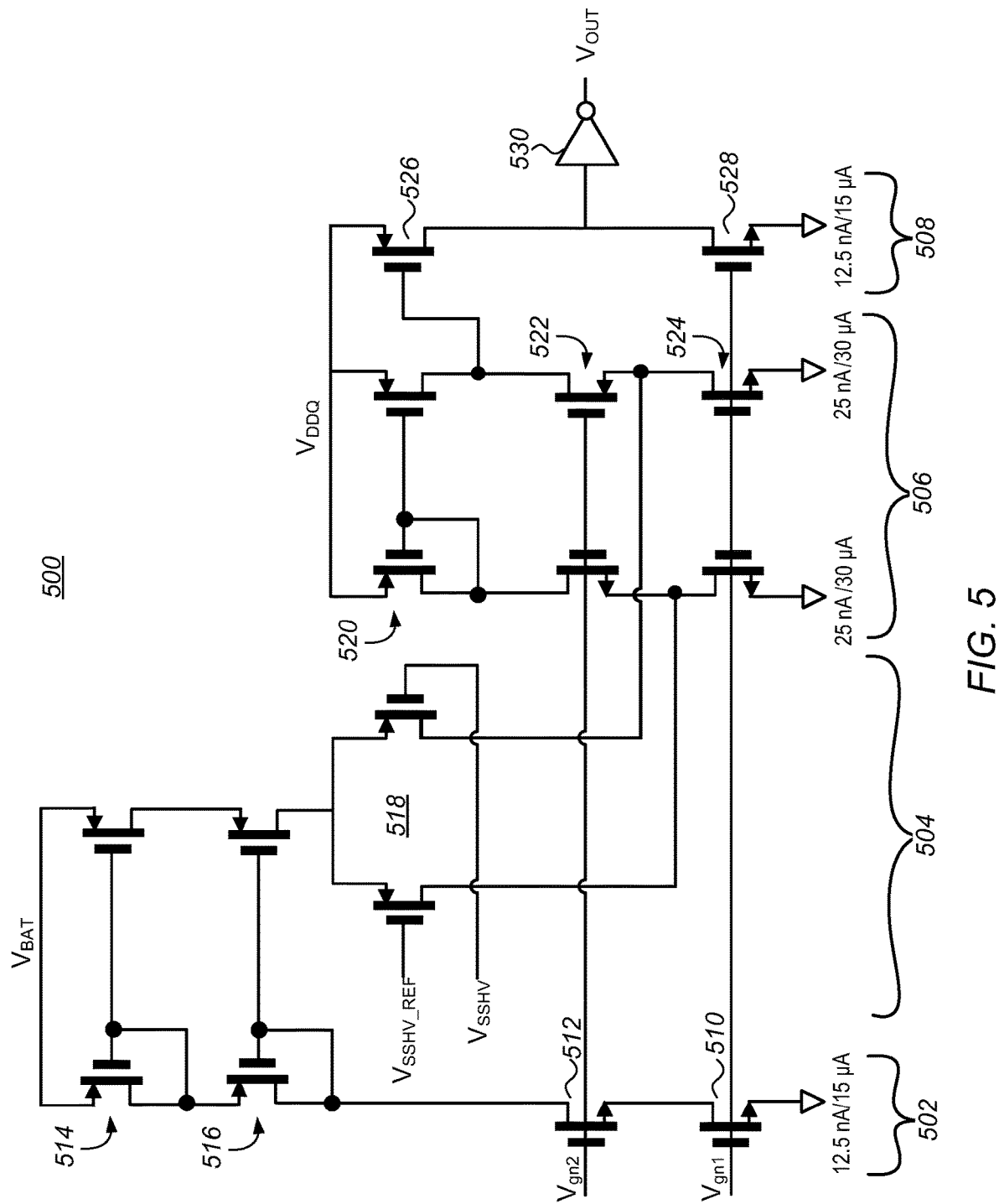
FIG. 5 is a schematic diagram of an embodiment of a comparator for use in the current-sink of FIG. 2.

FIG. 5 is a schematic diagram of an embodiment of a comparator for use in the current-sink of FIG. 2. Referring to FIG. 5, the comparator 500 has a folded-cascode topology including a biasing stage 502, an input stage 504, a cascode stage 506, and an output buffer 508. NMOS transistors 510 and 512, receive the voltages $V_{gn1}$ and $V_{gn2}$ from the dynamic biasing circuit 400, and through first and second current mirrors 514, 516 when dynamic biasing is enabled increase a voltage applied to a PMOS amplifier 518 in the input stage 504, thereby increasing gain of the PMOS amplifier and improving sensitivity and accuracy of the comparator 500.

The cascode stage 506 generally includes a PMOS current mirror 520 coupled to a voltage supply ($V_{DDQ}$), and first and second pairs of NMOS transistors 522, 524, coupled between the PMOS current mirror and ground and configured to amplify an output from the input stage 504. The output buffer 508 includes series connected PMOS and NMOS transistors 526, 528, and an inverter 530. The PMOS transistor 526 has a source coupled to $V_{DDQ}$, a drain coupled ground through the NMOS transistor 528, and a gate coupled to receive an output from the cascode stage 506. The NMOS transistor 528 has a drain coupled to $V_{DDQ}$, through the PMOS transistor 526, a source coupled ground and a gate coupled to receive the voltage $V_{gn1}$. Like the biasing stage 502 and the input stage 504, the biasing current of the cascode stage 506 and output buffer 508 is also increased when the dynamic biasing is enabled, and thus the propagation delay of the comparator 500 is reduced accordingly to ensure precise timing to turn off current sinking switch 202 at the end of current sinking phase. In particular, it is noted that as shown in FIG. 5, the biasing current of all stages 502, 504, and 506, and the output buffer 508 is increased when the dynamic biasing is enabled from a quiescent current of about 12.5 nA to about 30 μA.

Figure 6:
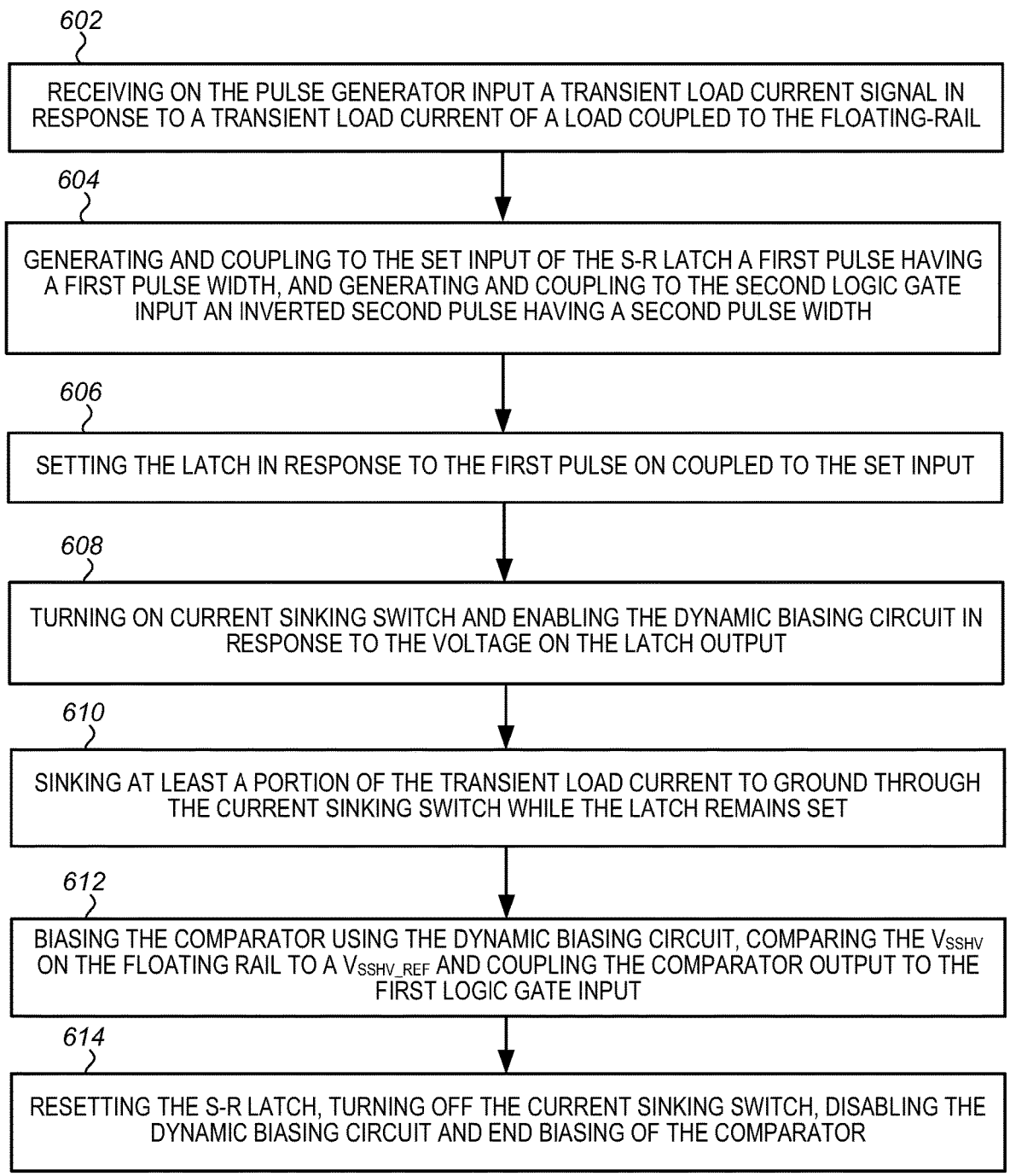
FIG. 6 is a flowchart illustrating a method for operating the current-sink of FIG. 2.

FIG. 6 is a flowchart illustrating a method for operating the current-sink of FIG. 2 to sink a transient load current. Referring to FIGS. 2 and 6, the method generally begins with receiving on the input the pulse generator 226 a transient load current signal 222 in response to a transient load current of a load 208 coupled to the floating-rail 206 (step 602). Where the transient in load current includes a large load current spike and a lower, steady load current, the method also begins with sinking the large load current spike through the capacitor 214 to ground.

Next, a pulse 228 having a pulse width is generated and coupled to the set input (S) of the S-R latch 218, and the inverted pulse coupled to the second logic-gate input of logic-gate 224 (step 604). It will be understood from the above description of FIG. 2, that the S-R latch 218 will remained latched after the pulse ends until a voltage or logic '1' is applied to the reset input from the logic-gate 224. It will further by understood that the pulse coupled through the inverter 232 is a logic '0', effectively ensuring that the output from the comparator 216 is not coupled to the reset input (R) of the S-R latch 218 until at least after a time corresponding to the pulse width.

The S-R latch 218 is then set in response to the pulse coupled to the set input (step 606), and the voltage on the latch output of the set S-R latch 218 turns on the current sinking switch 202 and enables the dynamic biasing circuit 220 (step 608). At least a portion of the transient load current is sunk to ground through the current sinking switch 202 while the S-R latch 218 remains set (step 610).

Next, the comparator 216 is biased or enabled using the dynamic biasing circuit 220, the floating-rail voltage ($V_{SSHV}$) on the floating-rail 206 compared to the floating-rail reference voltage ($V_{SSHV\_REF}$) and the comparator output coupled to the first logic-gate input of the logic-gate 224 (step 612).

Finally, after a time corresponding to the pulse width has passed so that logic '1' is on the second input of the logic-gate 224, if the comparator 216 output has reached a voltage corresponding to a logic '1', the logic-gate will output a logic '1' to the reset input to reset the S-R latch 218, turning off the current sinking switch 202, disabling the dynamic biasing circuit 220 and end biasing of the comparator (step 614).

Figure 7:
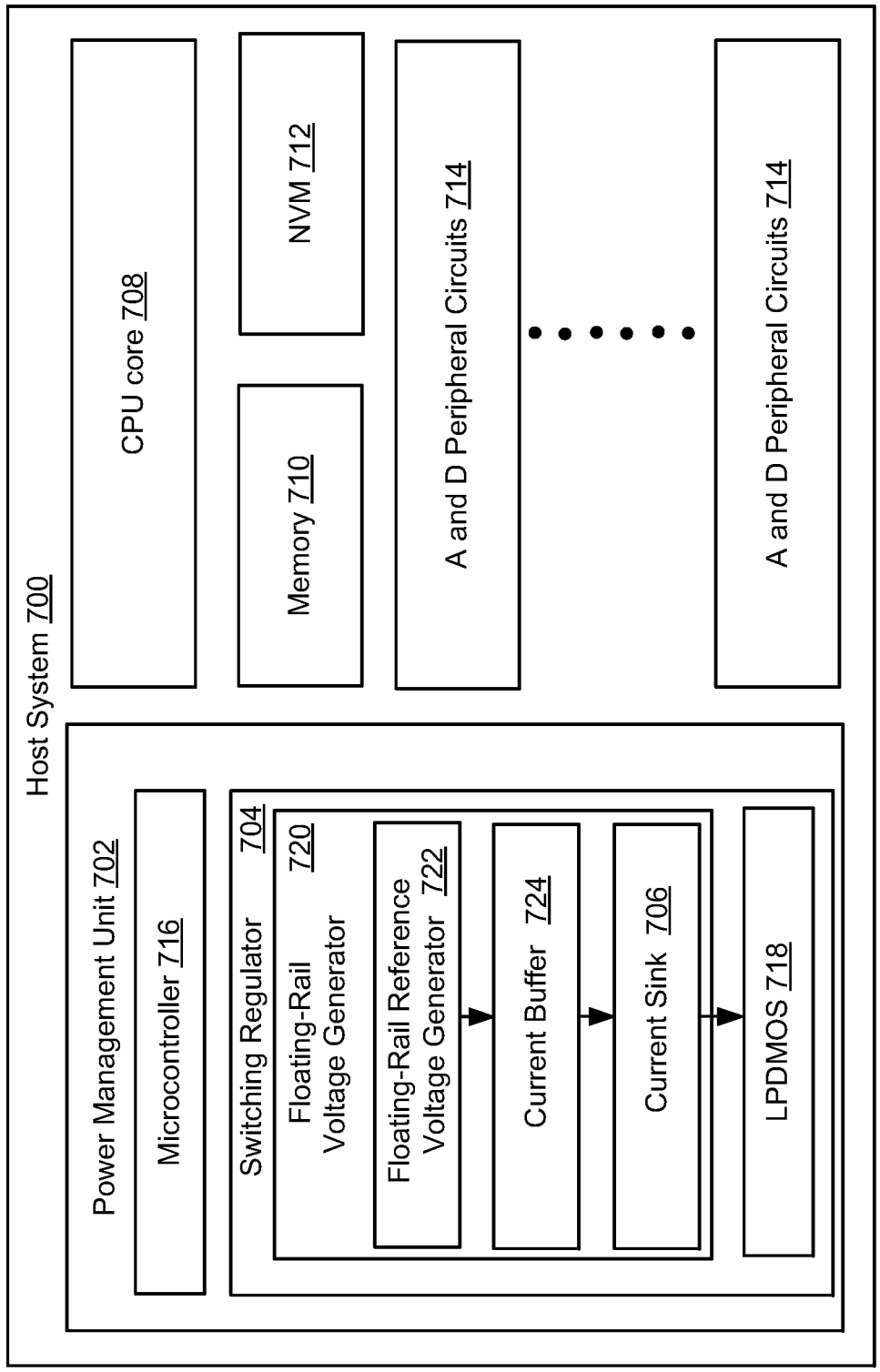
FIG. 7 is block diagram of a host system having a power management unit (PMU) with a switching regulator (SR) for which the dynamic biased current-sink including of the present disclosure is particularly useful.

FIG. 7 is block diagram of a host system 700 having a power management unit (PMU 702) with a switching regulator (SR 704) for which the dynamically biased current-sink 706 of the present disclosure is particularly useful.

Referring to FIG. 7, the host system 700 is generally a microcontroller unit (MCU) or programmable systems on a chip (PSoC) and can include a CPU core 708, volatile memory 710 and non-volatile memory (NVM 712), and a number of configurable integrated analog and digital peripheral circuits 714. Such MCUs are widely used in many automotive, and portable or non-portable electronic applications. Exemplary applications can include Bluetooth radios, and Wi-Fi hubs or receivers. The PMU can include, in addition to the SR 704, a microcontroller 716 that controls the SR 704 and governs power functions of host system 700.

The SR 704 is operable to convert a voltage from a battery or other DC power source into output voltages required by other subsystems or devices in the host system 700. The SR 704 generally includes a high-side switching transistor, such as a laterally-diffused PMOS (LDPMOS) transistor 718, controlled by or receiving a floating-rail voltage ($V_{SSHV}$) from a floating-rail voltage generator 720 to supply the required output voltages. In addition to the dynamically biased current-sink 706 of the present disclosure, the floating-rail voltage generator 720 can further include a floating-rail reference generator 722 and a current buffer 724 to generate and buffer a floating-rail reference voltage ($V_{SSHV\_REF}$). The dynamically biased current-sink 706 sinks transients in a load current, which can undesirably impact $V_{SSHV}$.

Thus, low-power, fast-transient current-sink and methods of operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A current-sink comprising:
   a latch system including a latch system input coupled to and operable to receive a transient load current signal indicating a transient load current in a load current of a load coupled to a floating-rail, and a latch system output, wherein the latch system comprises:
      a comparator having a non-inverting input coupled to a floating-rail reference voltage ($V_{SSHV\_REF}$), and an inverting input coupled to a floating-rail voltage ($V_{SSHV}$) on the floating-rail, and a comparator output, and
      a set-reset (S-R) latch having a set input coupled to and operable to receive the transient load current signal from the latch system input, a reset input coupled to the comparator output, and a latch output coupled to the latch system output; and
   a current sinking switch including a gate coupled to the latch system output, a first source/drain (S/D) terminal coupled to the floating-rail, and a second S/D terminal coupled to ground, the current sinking switch operable to sink at least a portion of the transient load current from the load to provide a stable floating-rail voltage ($V_{SSHV}$) on the floating-rail.

2. The current-sink of claim 1, further comprising a sinking capacitor coupled in parallel with the current sinking switch between the floating-rail and ground, wherein the transient load current includes a current spike and a lower, steady current, and wherein the sinking capacitor is operable to sink the current spike in transients load current to ground, and the current sinking switch is operable to sink the lower, steady current of the transient load current.

3. The current-sink of claim 1, wherein the latch system further comprises a dynamic biasing circuit coupled between the latch output and biasing voltage inputs to the comparator, the dynamic biasing circuit operable to receive a bias enable signal from the latch output and bias the comparator to increase its speed and accuracy therefrom to reset the S-R latch and stop the current sinking phase.

4. The current-sink of claim 3, wherein the latch system further comprises:
   a logic-gate including a logic-gate output coupled to the reset input of the S-R latch, a first logic-gate input coupled to the comparator output and a second logic-gate input; and
   a pulse generator including a pulse generator input coupled to and operable to receive the transient load current signal from latch system input, a pulse generator output coupled to the set input of the S-R latch, and coupled through an inverter to the second logic-gate input of the logic-gate,
   wherein the pulse generator is operable in response to the transient load current signal to output through the pulse generator output a pulse to set the S-R latch to generate the bias enable signal on the latch output and turn on the current sinking switch.

5. The current-sink of claim 4, wherein the dynamic biasing circuit is operable to be enabled only when the bias enable signal is received from the latch output so that quiescent currents through the dynamic biasing circuit and the comparator are minimized.

6. The current-sink of claim 1, wherein the comparator comprises a folded-cascode topology and is operable with a 0V floating-rail voltage ($V_{SSHV}$) on the inverting input.

7. The current-sink of claim 1, wherein the load coupled to the floating-rail comprises a switching regulator (SR) or power management unit (PMU).

8. A current-sink comprising a latch system including a set-reset (S-R) latch having a latch output coupled to a control gate of a current sinking switch coupled between a floating-rail and ground, wherein:
   the latch system further comprises:
      a comparator having a first comparator input coupled to a floating-rail reference voltage ($V_{SSHV\_REF}$), a second comparator input coupled to a floating-rail voltage ($V_{SSHV}$) on the floating-rail, and a comparator output coupled to a reset input of the S-R latch, the comparator operable to reset the S-R latch when a difference between $V_{SSHV\_REF}$ and $V_{SSHV}$ is less than a predetermined voltage; and
      a dynamic biasing circuit coupled between the latch output and the comparator, the dynamic biasing circuit operable to receive a bias enable signal from the latch output and bias the comparator to generate an output to reset the S-R latch when a difference between $V_{SSHV\_REF}$ and $V_{SSHV}$ is less than a predetermined voltage;
   the latch system is operable to set the S-R latch when a transient load current signal indicating a transient load current in a load coupled to the floating-rail is received;
   the S-R latch is operable to output from the latch output a voltage turning on the current sinking switch; and
   the current sinking switch is operable to sink at least a portion of the transient load current from the load to provide a stable floating-rail voltage ($V_{SSHV}$) on the floating-rail.

9. The current-sink of claim 8, wherein the latch system further comprises:
   a logic-gate including a logic-gate output coupled to the reset input of the S-R latch, a first logic-gate input coupled to the comparator output and a second logic-gate input; and
   a pulse generator including a pulse generator input operable to receive the transient load current signal, a pulse generator output coupled to a set input of the S-R latch, and through an inverter to the second logic-gate input of the logic-gate,
   wherein the pulse generator is operable in response to the transient load current signal to output a pulse to set the S-R latch.

10. The current-sink of claim 9, wherein the pulse generator and the inverter are operable to output a logic '1' to the second logic-gate input after the pulse has ended.

11. The current-sink of claim 10, wherein the comparator is operable to output a logic '1' to the first logic-gate input when a difference between $V_{SSHV\_REF}$ and $V_{SSHV}$ is less than a predetermined voltage, resetting the set the S-R latch and turning off the current sinking switch.

* * * * *